US010460955B2

(12) United States Patent
Derenge

(10) Patent No.: US 10,460,955 B2
(45) Date of Patent: Oct. 29, 2019

(54) METHODOLOGY FOR ANNEALING GROUP III-NITRIDE SEMICONDUCTOR DEVICE STRUCTURES USING NOVEL WEIGHTED COVER SYSTEMS

(71) Applicant: U.S. Army Research Laboratory ATTN: RDRL-LOC-I, Adelphi, MD (US)

(72) Inventor: Michael A. Derenge, Columbia, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 671 days.

(21) Appl. No.: 14/833,774

(22) Filed: Aug. 24, 2015

(65) Prior Publication Data

US 2016/0061528 A1  Mar. 3, 2016

Related U.S. Application Data

(60) Provisional application No. 62/041,525, filed on Aug. 25, 2014.

(51) Int. Cl.
*H01L 21/32* (2006.01)
*H01L 21/324* (2006.01)
*C30B 35/00* (2006.01)

(52) U.S. Cl.
CPC .......... *H01L 21/3245* (2013.01); *C30B 35/00* (2013.01)

(58) Field of Classification Search
CPC ..... C30B 33/05; C30B 35/00; H01L 21/3245; H01L 21/26546; H01L 21/02667; H01L 21/0254; H01L 21/02378; H01L 21/0242; F27B 17/0025
See application file for complete search history.

(56) References Cited

U.S. PATENT DOCUMENTS

| 3,291,574 | A | * | 12/1966 | Pierson | C30B 15/24 117/23 |
| 5,221,642 | A | * | 6/1993 | Burns | H01L 23/4951 148/DIG. 99 |
| 5,985,687 | A | * | 11/1999 | Bowers | H01S 5/0201 438/29 |
| 7,977,224 | B2 | | 7/2011 | Hager, IV et al. | |
| 2009/0004835 | A1 | * | 1/2009 | Drevet | C30B 11/002 438/486 |

(Continued)

OTHER PUBLICATIONS

Jordan D. Greenlee, et al., "Comparison of AlN encapsulants for high-temperature GaN annealing," Appl. Phys. Express 7 121003 (2014) (Available online Nov. 28, 2014).

(Continued)

*Primary Examiner* — Matthew J Song
(74) *Attorney, Agent, or Firm* — Eric Brett Compton

(57) ABSTRACT

An improved methodology for annealing group III-nitride semiconductor device structures using novel weighted cover systems that protect an annealing cap during the semiconductor annealing process is disclosed. The weighted cover system is configured for preventing the escape of nitrogen from the capped semiconductor during annealing. In one particular embodiment, the weighted cover system comprises a protective cover configured to be placed on the capped semiconductor during the anneal, and one or more weights configured to be placed on the protective cover to provide sufficient downward force to the protective cover that is placed on the capped semiconductor.

24 Claims, 13 Drawing Sheets

(56) References Cited

U.S. PATENT DOCUMENTS

| | | | | |
|---|---|---|---|---|
| 2009/0260656 | A1* | 10/2009 | Higashijima | H01L 21/31138 134/18 |
| 2010/0133656 | A1* | 6/2010 | Hager, IV | H01L 21/324 257/615 |
| 2012/0070936 | A1* | 3/2012 | Guha | H01L 21/02422 438/73 |
| 2013/0109180 | A1* | 5/2013 | Tanimoto | B24B 37/042 438/692 |

OTHER PUBLICATIONS

Michael A. Derenge, et. al., "Annealing studies of AlN capped, MOCVD grown GaN films," Solid-State Electronics, 101, Nov. 2014, pp. 23-28. (Available online Jul. 30, 2014).

T.J. Anderson, et al., "Activation of Mg implanted in GaN by multicycle rapid thermal annealing," Electronics Letters Jan. 30, 2014 vol. 50 No. 3 pp. 197-198.

Michael A. Derenge, et. al., "Annealing AlN Capped, MOCVD Grown GaN for Extended Periods of Time at Elevated Temperatures," International Semiconductor Device Research Symposium (ISDRS) 2013, Dec. 11-13, 2013 (abstract and poster).

Michael A. Derenge, et al., Poster Presentations Session AP2, Poster Session: Bulk and Film Growth, AP2.02 "Annealing GaN for Extended Periods of Time with an AlN Cap," International Conference on Nitride Semiconductors (ICNS) 2013, Aug. 25-30, 2013. (Poster Presentation Aug. 27, 2013, 6:00 PM-7:30 PM).

D. Pastor, et al., "The effect of substrate on high-temperature annealing of GaN epilayers: Si versus sapphire," Journal of Applied Physics 100, 043508 (2006).

* cited by examiner

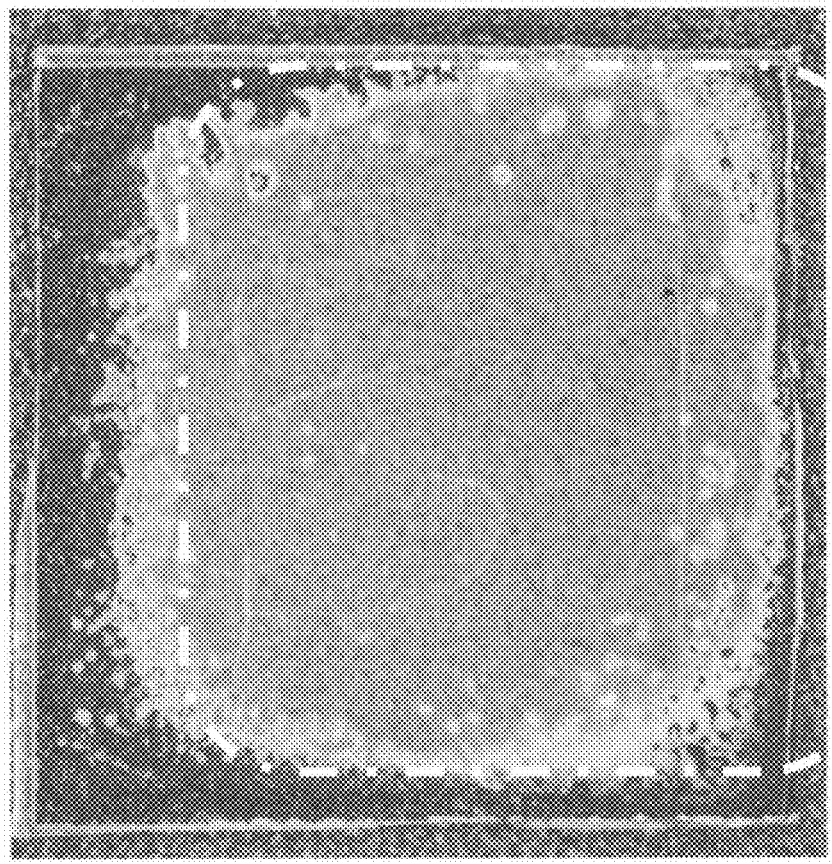
Figure 7. Schottky diode structure annealed at 1150 °C for 1 hour with thick sapphire cap. Only outer edges of III-Nitride survived and the center area is exposed sapphire.

Images of negative impressions of capped III-Nitride on silicon and sapphire covers.
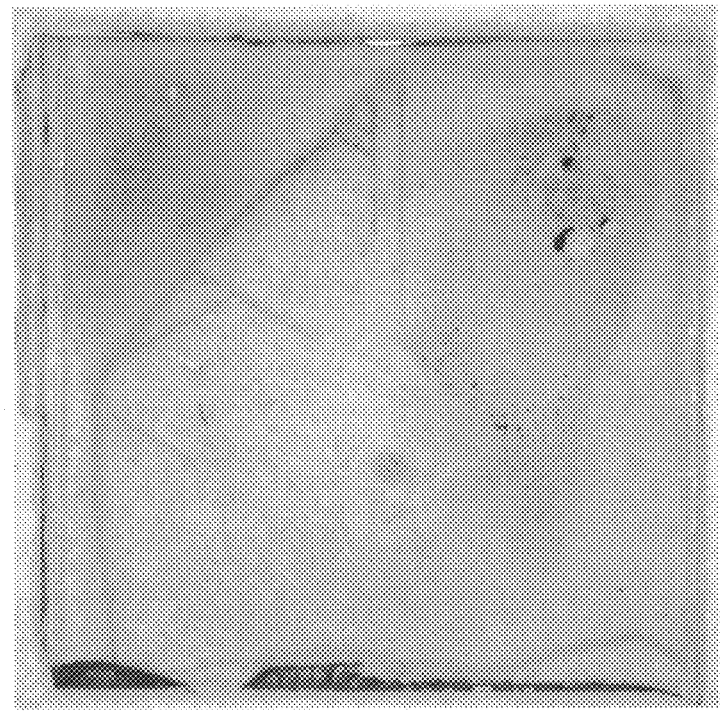
Figure 8 (II)
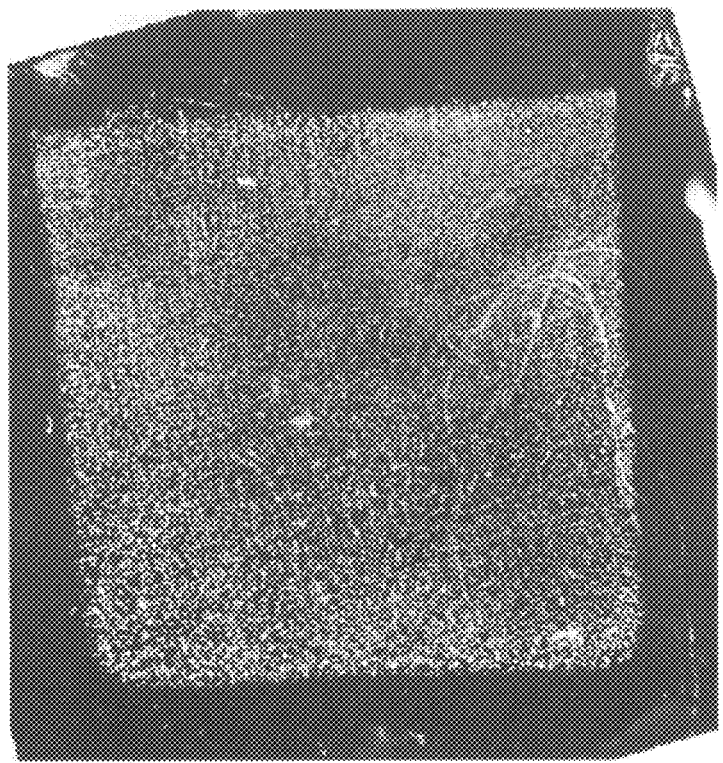
Figure 8(I)

X-ray anneal analysis

| Temp. °C | Time min. | Pre-anneal (002)arcsec | Annealed (002)arcsec | Pre-anneal (102)arcsec | Annealed (102)arcsec |
|---|---|---|---|---|---|
| 1150 | 30 | 275 (±1) | 251 (±1.7) | 416 (±8.2) | 389(±12.9) |
| 1200 | 30 | 271 (0) | 248 (±5.6) | 410(±10.5) | 356 (±9.2) |
| 1250 | 30 | 274 (±1) | 227 (±2.1) | 421 (±9.8) | 381(±16.3) |
| 1300 | 30 | 271 (0) | 227 (±4) | 398 (±11) | 353 (±3) |
| 1150 | 15 | 307 (±7.5) | 268 (±3.1) | 458 (±5.6) | 397(±10.7) |
| 1150 | 30 | 275 (±1) | 251 (±1.7) | 416 ±(8.2) | 389(±12.9) |
| 1150 | 60 | 244 (±3.2) | 232 (±4.7) | 409 (±2.6) | 362(±11.7) |
| 1150 | 90 | 282 (±2.2) | 250 (±3.2) | 427 (±7.5) | 415 (±1) |
| 1150 | 120 | 276 (±3.8) | 240 (±1.2) | 433 (±5.4) | 430 (±4.6) |

Figure 10.

METHODOLOGY FOR ANNEALING GROUP III-NITRIDE SEMICONDUCTOR DEVICE STRUCTURES USING NOVEL WEIGHTED COVER SYSTEMS

RELATED APPLICATION DATA

This application claims the benefit of U.S. provisional patent application No. 62/041,525 filed Aug. 25, 2014, herein incorporated by reference in its entirety for all purposes.

GOVERNMENT INTEREST

Governmental Interest—The invention described herein may be manufactured, used and licensed by or for the U.S. Government.

FIELD OF INVENTION

The present invention generally relates to semiconductor devices and semiconductor device fabrication, and in particular to, methods for activating doped semiconductor layers, materials or components by annealing.

BACKGROUND OF THE INVENTION

In the semiconductor industry, semiconductor wafer materials are annealed, so that dopant atoms, such as boron, phosphorus or arsenic, etc., can diffuse into substitutional positions in the crystal lattice, resulting in changes in the electrical properties of the semiconducting material.

Silicon has been found to evaporate from SiC when annealed at the temperatures required to activate nitrogen implants for n-type or aluminum for p-type SiC. To counter this problem, AlN or BN caps were found to prevent SiC decomposition up to 1600° C. in a nitrogen atmosphere.

However, implantation activation in the Group III nitride materials semiconductors, such as gallium nitride (GaN), is more difficult than with elemental semiconductor materials. In fact, it is well-publicized that Group III nitride materials decompose by preferential evaporation of nitrogen when annealed at high temperatures, because of the high vapor pressure of nitrogen.

It has been shown that silicon implants may be activated to make III-Nitride n-type by annealed in a Rapid Thermal Annealer (RTA) at high temperatures for short periods of time if capped with a capping layer of $SiO_2$, $Si_3N_4$ or AlN. Sequential short RTA processes have been used to activate implants while limiting decomposition. High nitrogen overpressure annealing can be used, but it requires specialized equipment to deal with dangerous pressures at high temperatures.

Accordingly, improvements for annealing Group III nitride semiconductors would be useful.

BRIEF SUMMARY OF THE INVENTION

An improved methodology for annealing group III-nitride semiconductor device structures using novel weighted cover systems that protect an annealing cap during the semiconductor annealing process is disclosed.

More specifically, a method for preventing the escape of nitrogen from a Group-III nitride semiconductor covered with an annealing cap during annealing is disclosed. The method includes: covering the annealing cap on the Group-III nitride semiconductor with a weighted cover system; and annealing the Group-III nitride semiconductor while covered with the weighted cover system. The method may further include forming the annealing cap on the Group-III nitride semiconductor. For instance, forming the annealing cap may comprise: depositing a first layer onto the semiconductor that acts as an adhesion and stress reduction layer; and depositing a second layer onto the first layer that acts as a mechanical support layer. In some embodiments, annealing caps can be formed on opposed surfaces of the semiconductor. An inert atmosphere or environment is provided inside the annealing furnace for annealing. After annealing, the weighted cover system and the annealing cap are removed from the annealed semiconductor.

In addition, a weighted cover system is disclosed which is configured to be placed on top of a Group-III nitride semiconductor covered with an annealing cap for preventing the escape of nitrogen from the capped semiconductor during annealing. Force can be applied to the weighted cover system by actual weight or a force equivalent to weight by a clamping apparatus, a pressure bladder, or a pressurized chamber. In one particular embodiment, the weighted cover system may comprise: a protective cover that is configured to be placed on the capped semiconductor during the anneal; and one or more weights configured to be placed on the protective cover to provide sufficient downward force to the protective cover that is placed on the capped semiconductor.

The protective cover may be formed of a refractory material, such as sapphire, SiC materials, Si, ZrO, MgO, YSZ, coated Si, or quartz. In some instances, the thickness of the protective cover is about 40-330 µm and the protective cover is sized larger than the surface of the capped semiconductor for which it covers. The protective cover preferably has sufficient flexibility to conform to the bow or warpage of the capped semiconductor. And to prevent damage to the annealing cap, the surface of the protective cover which faces the capped semiconductor is polished. In some embodiments, the protective cover and/or weight(s) can be a heat source of the annealing furnace. The protective cover can be advantageously provided with a ring on its top surface that is configured to hold the one or more weights, and the bottom surface of the protective cover can be provided with a rim that is configured to prevent the protective cover from sliding off the capped semiconductor.

The one or more weights may also be formed of a refractory material. To increase weight distribution on the protective cover, there may be a plurality of weights that are arranged in a tight packing orientation. Preferably, there is a distributed weight system configured to hold a plurality of weights and enable them to be placed on the protective cover and to move as the capped semiconductor bows or warps.

An annealing system for annealing in a furnace may comprise: a Group-III nitride semiconductor; an annealing cap formed on the semiconductor; and a weighted cover system placed on top of the capped semiconductor for preventing the escape of nitrogen from the capped semiconductor during annealing. In some instances, the annealing cap is formed of a first layer onto the semiconductor that acts as an adhesion and stress reduction layer; and a second layer onto the first layer that acts as a mechanical support layer. And, in various embodiments, the weighted cover system includes a protective cover configured to be placed on the capped semiconductor during the anneal; and one or more weights configured to be placed on the protective cover to provide sufficient downward force to the protective cover that is placed on the capped semiconductor.

These and other embodiments are described in more detail below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. These embodiments are intended to be included within the following description and protected by the accompanying claims.

FIG. 7 is a photograph of a thick group III-Nitride Schottky structure that was annealed at 1150° C. for 1 hour using a weighed cover system with a cover formed of 400 μm thick sapphire.

FIGS. 8(I) and (II) are photographs of some protective covers after annealing.

FIG. 10 is a table of Full Width at Half Maximum (FWHM) values from X-ray rocking curves before and after annealing of a series with increasing temperature and time increments.

FIG. 11 shows SEM micrographs of GaN surface defects.

DETAILED DESCRIPTION OF THE INVENTION

Embodiments of the present invention disclose an improved methodology for annealing group III-nitride semiconductor device structures using novel weighted cover systems that protect an annealing cap during the semiconductor annealing process.

An exemplary annealing cap structure for group III-nitride semiconductor device structures was previously disclosed in U.S. Pat. No. 7,977,224 B2, titled "Method using multiple layer annealing cap for fabricating group III-nitride semiconductor device structures and devices formed thereby," herein incorporated by reference in its entirety. This annealing cap structure comprises a Group III-nitride semiconductor, such as gallium nitride (GaN). Formed on top of the Group III-nitride semiconductor is an annealing cap that comprises a first adherence layer and a second, thicker layer that provides mechanical strength. Both the adherence layer and the thicker layer may be formed of aluminum nitride (AlN), for instance. The first adherence layer gives the cap good adhesion and complete coverage, while the second, thicker layer gives it added strength.

As will be further appreciated by those in the art of semiconductor fabrication, the semiconductor is implanted with suitable dopants atoms or ions which can create a charge carrier in the semiconductor (a hole or electron, depending on if it is a p-type or n-type dopant). Following implantation, the annealing cap is formed on the doped semiconductor material. Then, the capped semiconductor is subjected to an annealing process at a sufficient temperature and for sufficient time such that the implanted dopants can diffuse into the crystal lattice of the semiconducting material and/or otherwise be activated. After annealing, the annealing cap is removed from the semiconductor.

In this capping structure, the AlN forms a strong bond to a GaN semiconductor layer. Without the annealing cap, then the Ga and N bonds at the interface are free and this would allow the GaN to decompose with less energy.

Figure 3:
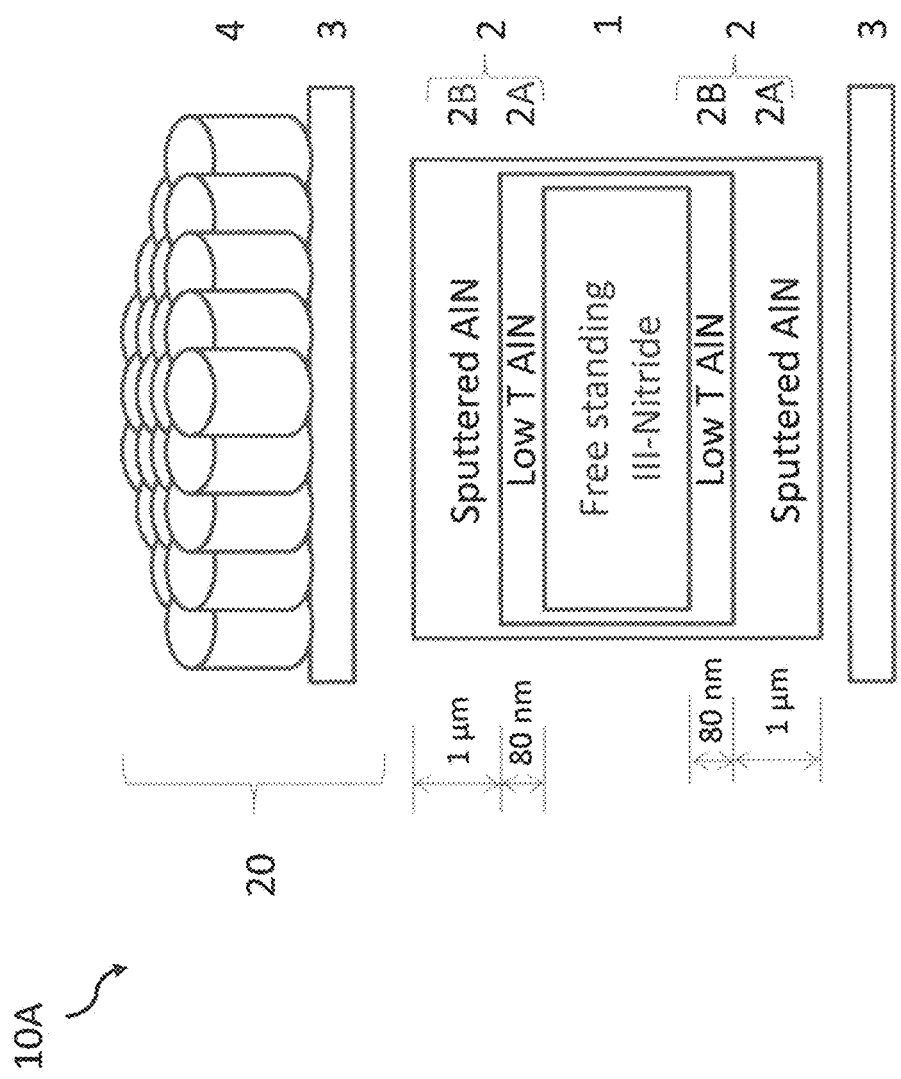
FIG. 3 is a schematic illustration of another embodiment of annealing system which includes the weighed cover system.

Previous experiments have shown that the annealing cap structure of the '224 patent alone may be suitable for short (i.e., less than about 4 minutes), low temperature (i.e., less than about 1200° C.) anneals. But for longer and/or high temperature anneals, it cannot effectively protect the semiconductor. Scanning electron microscope (SEM) micrographs of annealing cap surfaces of implanted GaN samples annealed at 1100, 1150, 1200, 1250 and 1300° C., and are shown in FIG. 3 of the '224 patent. The whole surface of samples was characterized by optical profilometry and then capped. After annealing and cap removal, decomposed areas were matched with large defects that were previously characterized. These SEM micrographs show no significant disruption in the annealing cap surface until the annealing temperature reached about 1250° C., at which temperature, a few cracks can be seen. After about 1300° C., however, the annealing cap is destroyed.

The probable cause for the destruction of the annealing cap is believed to be the nitrogen escaping from the GaN. The annealing cap failure mechanism is theorized to begin with localized decomposition at large defects in the group III-Nitride and/or AlN capping film. Nitrogen vapor pressure from decomposition increases causing cap delamination size to increase to a critical size where the AlN film cracks to release N pressure. Decomposition accelerates due to decreased N vapor over-pressure, but in a preferential direction normal to the C-plane. The released pressure stops delamination expansion and the hexagonal pit that grows deeper with time and temperature is roughly the size of the delamination. Decomposition is more normal to the exposed C plane with slow decomposition in the {11-2i} planes.

Figure 1:
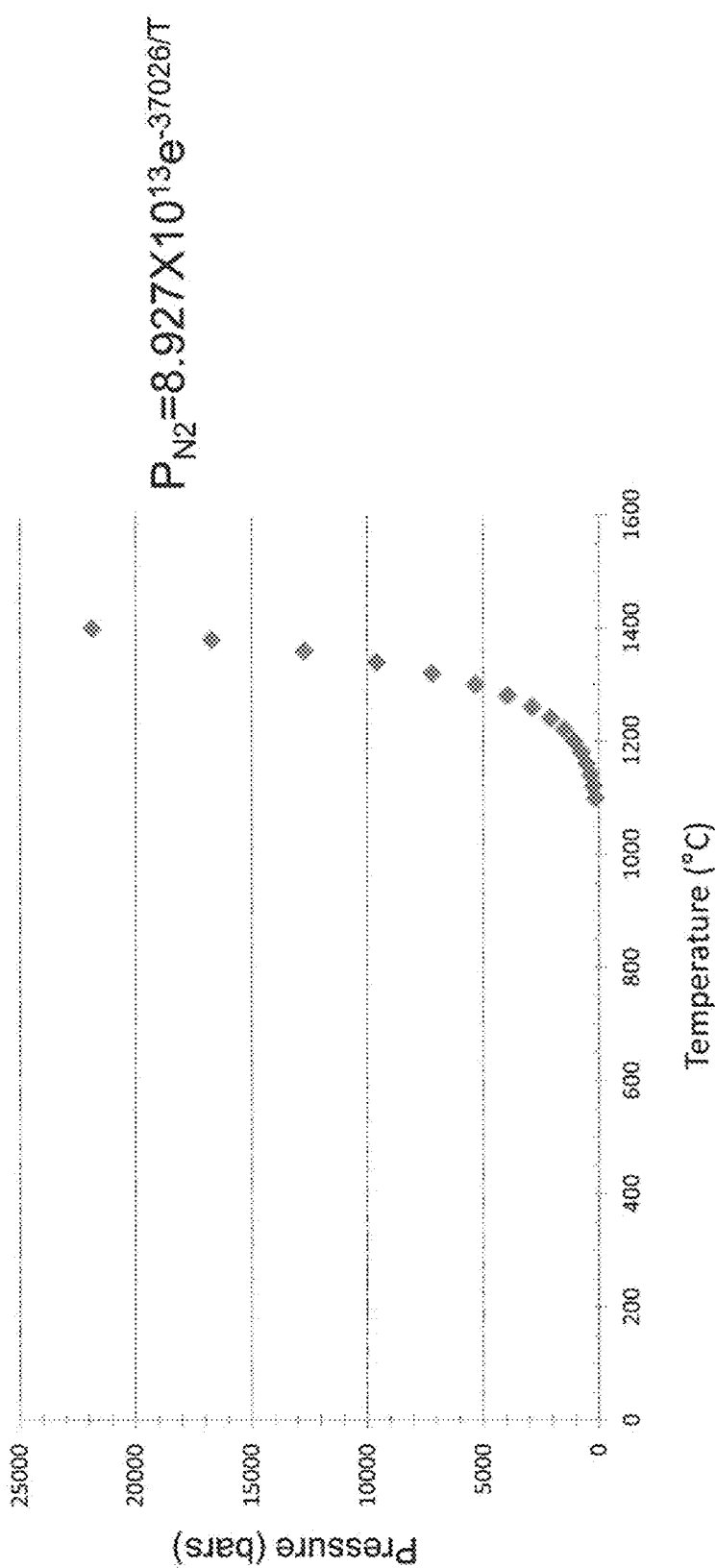
FIG. 1 shows the nitrogen vapor pressure as a function of temperature that would be required to prevent GaN decomposition during annealing.

FIG. 1 shows the nitrogen vapor pressure as a function of temperature that would be required to prevent GaN from decomposing during annealing. In the pressure regime below 1000 bar the $N_2$ partial pressure, $P_{N2}$, in equilibrium with GaN has a simple exponential relationship because it behaves like an ideal gas, and it is given by the following equation:

$$P_{N2} = 8.927 \times 10^{13} \, e^{-37026/T}$$

where $P_{N2}$ is given in bars and T is in °K. Using this equation, the temperature at which $P_{N2}$=1000 bar (100 MPa), the yield stress of GaN at 1000° C., is about 1195° C.; the temperature at which it would equal 125 MPa, the fracture stress of GaN at about 1000° C., is about 1210° C. Since the partial pressure curve begins to deviate from the exponential relationship at 100 bars, a 25° C. assumed error could be added to these two temperatures.

It is therefore surmised that the highest (theoretical) temperature the annealing cap can reasonably withstand is about 1250° C. without significant deterioration. This further suggests that annealing caps subjected to temperatures in excess of 1250° C. during the annealing process will not retain complete coverage during the anneal due to the formation of micro-cracks and/or blow holes. As a result, some nitrogen evaporates preferentially through these openings leaving nitrogen vacancies, behind that could act as donors as well as the activated silicon implants.

In view of the foregoing problems, the novel weighted cover systems according to embodiments of the present invention are used to protect the annealing cap covering the Group-III nitride during the semiconductor annealing process. More specifically, the weighted cover systems prevent the escape of nitrogen from a Group-III nitride semiconductor covered with the annealing cap during annealing by applying a counter force to the high pressures used during the annealing process. By applying this counter force, delamination of the capping layer can be inhibited and/or prevented. Thus, the annealing time and/or temperature of capped Group-III nitride semiconductors can be advantageously extended over what was previous thought possible. Additionally, the novel weighted cover systems improve the crystal quality of Group III nitride and reduce defect density in the bulk and/or surface damage from polishing, ion implantation and etching.

An inert atmosphere or environment is typically needed in the annealing furnace to prevent nitrides such as AlN, from oxidizing during the annealing. For example, once AlN oxidizes to $Al_2O_3$, it is very difficult to remove or etch off. Nitrogen ($N_2$) is one common inert gas that can be used in the annealing furnace, although there are many others. For example, any of the noble gases (e.g., He, Ne, Ar, Kr, and Xe) can be used to provide an inert atmosphere, even though, it is noted that they are generally more expensive than nitrogen. Ammonia gas could potentially be used also; but it is toxic and may require expensive double walled tubing, special vacuum pumps with fluorinated pump oils, gas monitoring and OSHA/safety office approval. Additionally, a vacuum could be formed in the annealing furnace to provide no atmosphere; although it has been found that by having (high) pressure in the furnace during annealing, it is less likely that the Group III nitride will decompose. In any event, while nitrogen is described herein as being used for annealing, it will be appreciated that other inert gases or means for providing a suitable inert atmosphere or environment in the annealing furnace during annealing can also be used in keeping with the scope of the invention.

Embodiments of the present invention may be particularly well-suited for use in nitride-based devices such as Group III-nitride based high-electron-mobility transistors (HEMTs), Schottky diodes, junction barrier Schottky (JBS) diodes and p-n junction devices, as well as field termination structures.

Figure 2:
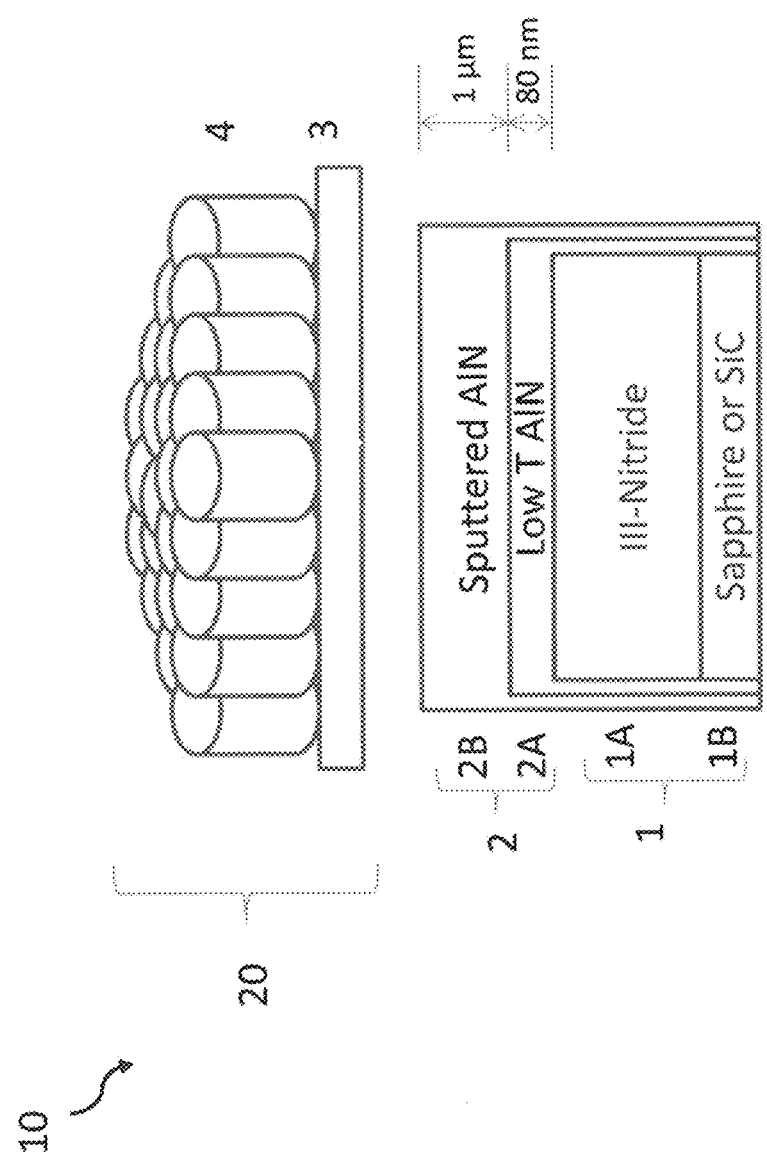
FIG. 2 is a schematic illustration of an annealing system which includes a novel weighted cover system in accordance with embodiments of the present invention.

FIG. 2 is a schematic illustration of an annealing system 10 which includes one novel weighted cover system 20 in accordance with embodiments of the present invention. The annealing system 10 includes a semiconductor layer or base 1, having thereon an annealing cap 2 formed thereupon, along with the weighted cover system 20 which includes a protective cover 3 and weights 4.

The semiconductor layer or base 1 may be a Group III nitride, for example. As used herein, the term "Group III nitride" refers to those semiconducting compounds formed between nitrogen and the elements in Group III of the periodic table, usually aluminum (Al), gallium (Ga), and/or indium (In). The terminology Group III-N also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. For example, the formula $Al_xGa_{1-x}N$ where $0 \leq x < 1$ is descriptive of a ternary compound, where one mole of nitrogen is combined with a total of one mole of the Group III elements. Likewise, the terminology x=0 when used in conjunction with the formula $Al_xGa_{1-x}N$ indicates that the layer or semiconductor material is GaN; and when x=1, the layer or semiconductor material is AlN. Those of ordinary skill in the art can readily appreciate that the terminology "III-Nitride," "Group III-N" and/or "Group III-nitride" in conjunction with a layer or semiconductor material as used herein may also encompass other Group III-nitrides, such as InGaN, AlInGaN or the like. It is noted that diamond-like nitrides of aluminum, gallium and indium have similar characteristics in that all have the wurtzite structure in which each atom occupies tetrahedral sites. For example, generally speaking in aluminum nitride (AlN), each aluminum atom has four neighboring nitrogen atoms at the corners of a tetrahedron and similarly each nitrogen atom has four neighboring aluminum atoms at the corners of a tetrahedron.

Until a few years ago, there were no III-Nitride homoepitaxial substrates for deposition of device films. Most III-nitride depositions are still currently done on heteroepitaxial substrates like sapphire, SiC or Si. D. Pastor, R. Cusco, L. Artus, G. Gonzalez-Diaz, E. Iborra, et. al., Journal of Applied Physics 100, 043508 (2006) published (JAP 100) that GaN on silicon cannot be annealed because "the strong reactivity between Ga and Si gives rise to the decomposition of GaN with the formation of $Si_3N_4$ crystallites, metallic Ga droplets, and Si nanocrystals." These heteroepitaxial substrates do not have the same thermal coefficient of expansion or lattice constants. This lattice mismatch and thermal expansion imparts defects and stresses that cause cracking as well as saddle point, concave and convex bowing. Heteroepitaxial substrates may start out flat, but after III-nitride deposition at high temperatures, they are bowed at room temperature. Annealing is performed at temperatures 100 to 600° C. above film deposition temperatures. Different substrates and processes produce different bowing stresses, but most heteroepitaxial III-nitride film are convex at room temperature and concave at annealing temperatures.

In the embodiment shown in FIG. 2, the semiconductor layer or base 1 may be comprised of a Group III Nitride material 1A formed on a sapphire or silicon carbide (SiC) substrate 1B, for instance. The III-nitride on sapphire base 1 of this structure is preferably placed with the III-nitride material 1A facing upward in the annealing furnace. It is noted that the III-Nitride material 1A can be of any orientation (e.g., N-polar, Ga-polar, polar, semi-polar and/or non polar). It is expected though that some orientations may prove better than others after annealing.

The semiconductor layer or base 1 is covered with the annealing cap 2. The annealing cap 2 may comprise two separate layers; a first adhesion layer formed 2A of a compound which adheres to the semiconductor layer or base 1 and a second thicker layer 2B that provides good mechanical strength. In some embodiments, the annealing cap 2 may be formed as disclosed the aforementioned '224 patent.

The term "cap" as used herein may be in the form of a layer and is not meant to imply any particular shape or form as the term "cap" as used herein may be of a variety of shapes and forms, including circular, rectangular, square, etc. Although a substantially constant thickness is depicted in FIG. 1, the thickness or cross-section may vary from one end of the cap to another. Inasmuch as the same compound (in one embodiment, AlN) may be used to form both the adhesion layer and the mechanical strength layer, coalescence may take place to transform the two layers into one without departing from the scope of the present invention. Similarly, multiple layers (in excess of two) could be used without departing from the scope of the present invention.

The adhesion layer 2A may be formed of AlN layer having a thickness about of 30 to 130 nm which may be deposited by metal organic chemical vapor deposition (MOCVD) at a temperature in the range of 450 to 1100° C. in some embodiments. It is used primarily for adhesion, a material that can adhere to the GaN surface may be substituted for AlN without departing from the principles of the present invention. For example, a material such as AlGaN could be utilized provided that the percentage of gallium is such that the AlGaN composition is different enough from the gallium nitride layer upon which it is deposited so that it may layer be selectively etched off or otherwise removed. Moreover, the adhesion layer 2A functions also as a nitrogen gas barrier. The adhesion layer 2A can also be considered a stress reduction layer because AlN deposited at lower temperatures do not crack when cooled. AlN deposited by MOCVD and/or PLD above 1000° C. can crack when deposited over 20 nm. Stress engineered epitaxial layers can also start deposition at 450-600° C. and then temperature ramped up or stepped up while depositing to higher temperatures like 1100° C. This lower stress film will have desirable properties of AlN from both temperature ranges. Likewise, it is noted that impurities may be present in the AlN which do not impact the adherence properties without departing from the scope of the present invention. The adhesion layer 2A is described as being epitaxial AlN films grown by MOCVD. However, other epitaxial processes, such molecular beam epitaxy or other methods which provide enhanced adherence may be utilized without departing from the scope of the present invention. The term "epitaxy," as used herein, encompasses varieties of epitaxy such as heteroepitaxy, a kind of epitaxy performed where a crystalline film grows on a crystalline substrate or film of another material. Such technology is often applied to growing crystalline films of materials of which single crystals cannot be obtained and to fabricating integrated crystalline layers of different materials.

The second, thicker layer 2B can be a sputtered AlN film having a thickness as little as 25 nm, but more typically about 1000 nm. It can be deposited at approximately 500° C. This temperature is not critical; although, it has been found that the density of the layer 2B generally increases with the deposition temperature. Nitrides other than AlN may be utilized that have sufficiently strength characteristics without departing from the scope of the present invention. Generally speaking, silicon nitride and gallium arsenide are not as strong as AlN and hence, may not be as desirable as AlN for some applications. The thicker layer 2B is used primarily for strength and because it will not decompose at the annealing temperatures used that could cause evaporation of the cap. AlN may be a desirable material for this layer because is not attacked chemically by the nitrogen or argon gases that are typically used in an annealing furnace. However, any material that would not evaporate or be chemically attacked at these annealing temperatures could be used instead of the AlN; e.g., high melting points oxides, carbides and nitrides which are sufficiently strong, and which can also be etched off. Tantalum nitride, titanium nitride and boron nitride possess the requisite strength characteristics but may prove to be more challenging than AlN with respect to adhesion qualities.

The Group III nitride semiconductor 1 is initially implanted with dopants or ion which can create a charge carrier in the semiconductor, as described above, and then capped with the anneal cap 2. During the annealing process, the implanted dopants can diffuse into the crystal lattice of the semiconducting material and/or otherwise be activated.

The protective cover 3 and weights 4 of the weighted cover system 20 are advantageously used to cover the annealing cap 2 during the annealing process. The cover 3 and weights 4 can be placed on the capped semiconductor 1 before or after it is put in the annealing furnace. They provide a downward force that inhibits or works against the force created by nitrogen vapor pressure from III-Nitride decomposition. With the weighted cover system 20 placed on top of the AlN cap during the anneal, the delaminations are inhibited from growing to a size where the cap cracks. Experiments have shown that the annealing cap 2 can survive at 1250 to 1350° C. with the addition of weighted cover system 20. Preferably, the protective cover 3 conforms to the shape of capped III-Nitride semiconductor, as further discussed below. After annealing, the weighted cover system 20 and the annealing cap 2 will be removed from the semiconductor layer or base 1.

The selection of the material for the cover 3 is important to the annealing process. If the cover 3 is highly conductive, for instance, then it could potentially interact with the heating source of the annealing system which typically use induction or microwave heating. For instance, tungsten is a refractory metal that would be a heat source in an induction or microwave heating system and it would be an added complication to model. Tungsten may not be likely to conform to the capped semiconductor until it gets close to its melting temperature of 3410° C. At III-Nitride annealing temperatures, it still has a tensile strength of 50 Kpsi.

The protective cover 3 may be formed of a refractory material. Suitable materials for the cover 3 may include, but are not limited to: sapphire, ZrO, MgO, YSZ (Yttria stabilized Zirconia, SiC materials (such as 6H—SiC), Si (with optional $SiO_2$, $Si_3N_4$, AlN, AlON films), and quartz. Silicon is relatively cheap and is may be advantageously used for annealing of thin III-Nitride films (e.g., <7 µm) at 1300° C. or below. Moreover, silicon melts just above 1400° C. so there is no need to go much higher than about 1350° C. Other cover materials, such as sapphire and silicon carbide (SiC), can be heated to 1400° C. or even higher temperatures and provide protection for the annealing cap 2. Although, thin sapphire may be preferable for the cover 3 over Si, in some instances, because of reactivity concerns.

The cover 3 may have a thickness of about 40-330 µm, for example, in some implementations. The protective cover 3 may be most effective if it sufficiently flexible to conforms to and distributes force across the surface of the annealing cap 2. With thermal warpage changes common in III-nitride films, thin refractory films are more able to flex with the III-Nitride composite films to maintain distributed conforming stress on the film being annealed. Thin films of aluminum oxide, SiC, or BN may not creep at these temperatures, but they will flex to contours. Sapphire, Si and SiC have been used successfully demonstrated in experiments as the cover 3 and they were all successful in helping a multiple layer AlN annealing cap 2 to protect a III-Nitride material 1. Thicker (e.g., 430 μm) sapphire covers were used first and they protected thin (e.g., less than 3 μm) III-nitride films on sapphire, but when they were annealed the center of the III-Nitride material started to fail and it was determined that the III-Nitride was bowing concave and the rigid sapphire cover was only contacting the III-Nitride around the edges. Of the silicon materials, initial testing suggests that oxide coated Si works best.

In some embodiments, n+4H—SiC can be used as the cover 3 since it provides an inert, smooth, highly conductive cover to evenly conduct the heat to the III-Nitride during the anneal. The n+4H—SiC material is useful because it can also serve as a heating susceptor for RTA, RF induction, microwave and/or laser heating. The N polar face is less stable. A small amount of the outer edges decomposed, but the III-Nitride wafer survived. The free standing group III-Nitride base 1 has its N polar face up, and the cover 3 has its Si n+4H—SiC face up. The weight of the III-Nitride of base 1 itself can be used to apply a force against the cap (III-Nitride face down).

During the annealing process, the cover 3 just sits on the annealing cap 2. That is, it is not affixed or otherwise connected to the cap 2. Preferably, the surfaces of the cover 3 are polished to prevent damage to the cap 2. The cover 3 can be sized larger and centered over the cap 2 such that the rim 5 does not contact the cap 2. For instance, the cover 3 might be made to be about 5 mm larger in length and width than the annealing cap 2, for example, to provide proper coverage. The cover 3 and cap 2 are typically made of different materials and can expand at different rates during the anneal. Thus, the weights 4 should apply vertical forces on cover 3 and the cap 2, and not apply any added lateral forces. In the annealing furnace, the heat source can be located at any direction from semiconductor layer or base 1. The cover 3 can even be the heat source of the annealing furnace in some embodiments. For example, SiC can be a susceptor of radiation in such a furnace.

While in theory, the protective cover 3 could be placed directed on the semiconductor layer or base 1, with only the annealing cap 2A, initial testing has suggested that this technique may not be so effective. For instance, when the cover 3 was placed onto a semiconductor wafer 1 with only a MOCVD deposited AlN film 2A for an anneal at 1150° C. for 15 minutes, the GaN film decomposed. The additional strength provided by of the thicker layer 2B of the annealing cap 2 is believed to be important. But other techniques could possibly make this approach more effective though.

It may be possible that the protective cover 3 could be reused after an anneal provided it is not damaged. But it is noted that silicon and quartz (and perhaps other materials) creep at the temperatures that are required for annealing III-Nitrides. In such cases, it may be better not to reuse the cover 3, especially since silicon and quartz are relative cheap.

The weights 4 provide a downward force upon the protective cover 3. In some embodiments, the protective cover plate 3 could be made of a denser material and/or made thicker to provide sufficient weight without the need for additional weights 4. However, in practice, the semiconductor layer or base 1 may not be truly flat rather being bowed or warped before and/or during annealing. Thus, providing separate weights 4 is advantageous to help the protective cover 3 conform better to a convex- or concave-warped semiconductor layer or base 1. The weights 4 may comprise one or more individual weights. Although, one weight alone might not be able to provide sufficient vertical force distribution for a warped or bowed semiconductor layer or base 1 either. In one test using a single weight, the silicon broke violently, although the silicon under the weight remained.

The weights 4 can be formed of a material which does not readily melt or decompose during annealing. If a conductive weight is used then it would be a source of heat above the III-Nitride film if induction, rf or microwave heating is used. Many annealing furnaces use a rf induction coil around a graphite susceptor. It could be useful, but it complicates the experiment and is harder to model. Refractory materials have been found to be one good material for the weights 4. Insulating alumina or Yttria stabilized ZrO cylindrical rods can be used for the weights 4, for example, because they are excellent refractories and commercially-available in small diameter sizes (e.g., about 3 mm). In some embodiments, the rods can be placed in a tightly packed arrangement, such as in a "honeycomb" or hexagonal-packing orientation. Square rods might also be used to provide even tighter packing Experiments have shown that seven (7) weights with a mass totaling 2.5 grams (total weight of 0.0245 N) may provide sufficient force to the annealing cap 2 for some applications. Although, it is believed that more or less weight may be sufficient for other applications. The weights 4 are preferably reused after each anneal.

The distributed refractory weights 4 on protective cover 3 provide a vertical, downward force against the annealing cap 2 thus suppressing delamination and III-Nitride decomposition. The weights 4 can be placed on and removed from the cover 3 (e.g., manually) by tweezers, for example.

Force equivalent to weights 4 might be applied to the protective cover 3 by other means according to other embodiments of the invention. For example, clamps and clamping apparatus which clamp the protective cover 3 and the capped semiconductor 1 to one another can be used to create force. While clamps typically do not distribute forces well, for very thin capped materials, this approach has been shown to be effective. A pressure bladder which contacts an upper surface of the annealing furnace or perhaps the surface of some other structure therein might also used to create a downward force, provided it can withstand the high annealing temperatures. Force might also be applied during annealing by pressurizing the environment in a Rapid thermal annealer (RTA) or otherwise during Rapid Thermal Processing (RTP). The U.S. Navy has developed a RTA with a pressure vessel that is pressurized at 200 PSI during the equipment. (Electronic Letters, 30 Jan. 2014, Vol. 50 No. 3 pp. 197-198). Such equipment could be very expensive and operating at high pressures could potentially be dangerous. Despite such potential drawbacks, for some applications, these other force application means might still be an acceptable choice.

FIG. 3 is a schematic illustration of another embodiment of annealing system 10A which includes the weighed cover system 20. Here, the semiconductor layer or base 1 is capped on both surfaces with the annealing cap 2. In some instances, freestanding GaN can capped with the multiple layer AlN annealing cap on both its faces, i.e., the Ga polar and N polar face. In one embodiment, the annealing system (from top to bottom) comprises refractory weights 4, a thin silicon cover 3, and AlN cap layers 2 formed on both side of free standing Group III-Nitride base 1.

Figure 4:
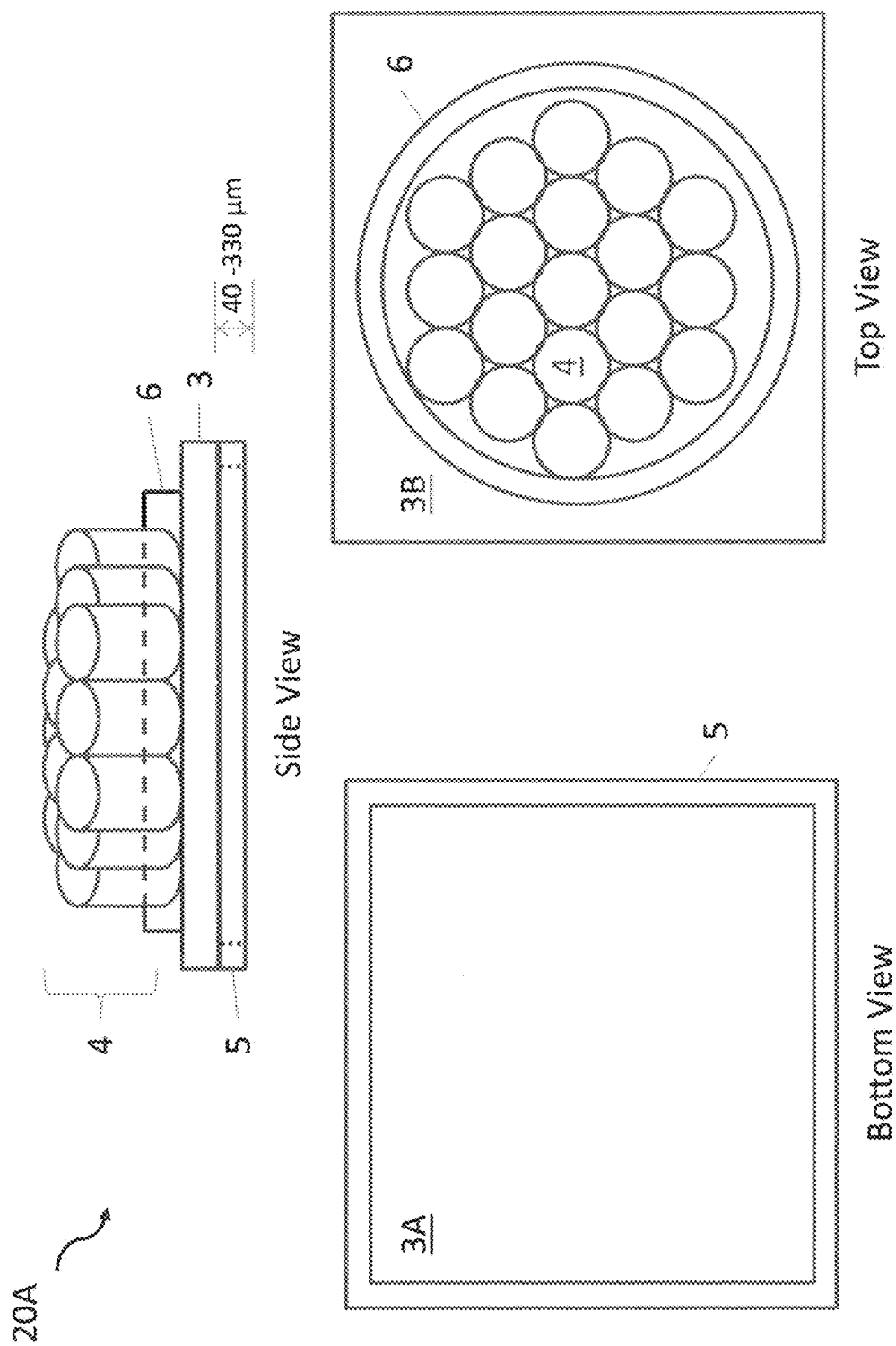
FIG. 4 shows another embodiment of the weighed cover system including the protective cover and weights.

FIG. 4 shows another embodiment of the weighed cover system 20A including the protective cover 3 and weights 4. It has been recognized that there is a potential problem with the cover 3 sliding off of the cap 2 at some time during annealing such as during vacuum outgassing, heat outgassing, and other vibrations of environment. To solve this problem, a rim structure 5 may be formed around the perimeter of the cover 3 on the bottom surface 3A of the cover 3. The cover 3 is preferably sized larger and centered over the cap 2 such that the rim 5 does not contact the cap 2. But if relative movement does occur, the rim 5 prevents the cover 3 from sliding off the cap 2. For some implementations, the rim 5 can be formed of a 1 mm thick layer of photoresist film can be patterned around the perimeter or outer edge of the cover 3 on its bottom surface 3A. It may be carborized during the high temperature anneal, but not significantly damaged.

A ring 6 can be adhered on the top surface 3B of the cover 3 to hold the weights 4 in place and prevent them from moving or toppling over; it can be cylindrical, square, or hexagonal, for example. The ring 6 may be fabricated of a refractory material, such as alumina. It may be sized to have an inner diameter of about 10 mm and be less than 3 mm thick. The weights 4 are generally taller. The ring 6 may be adhered to the top surface 3B of the cover 3 with a suitable adhesive which is capable of being annealed. In some instances, photoresist film can be used for this purpose. The weights 4 are placed inside the ring 6 so they do not move or fall off the cover 3 during the annealing process. The anneal furnace is then closed making sure that the anneal structure is not disturbed. After the anneal, the weights 4 and then the ring 6 are removed. The cover 3 should easily be lifted off to be removed, but occasionally, it is expected that a little lateral force may be needed to help separate the cover 3 and the cap 2.

A distributed system of weights that is freestanding and configured to enable the weights 4 to be laid flat on the protective cover 3, but later moves as semiconductor layer or base 1 bows or warps, is advantageous. Such a system also allows the weights to apply more distributed vertical forces across the surface of the cover 3 without imposing added lateral forces.

Figure 5:
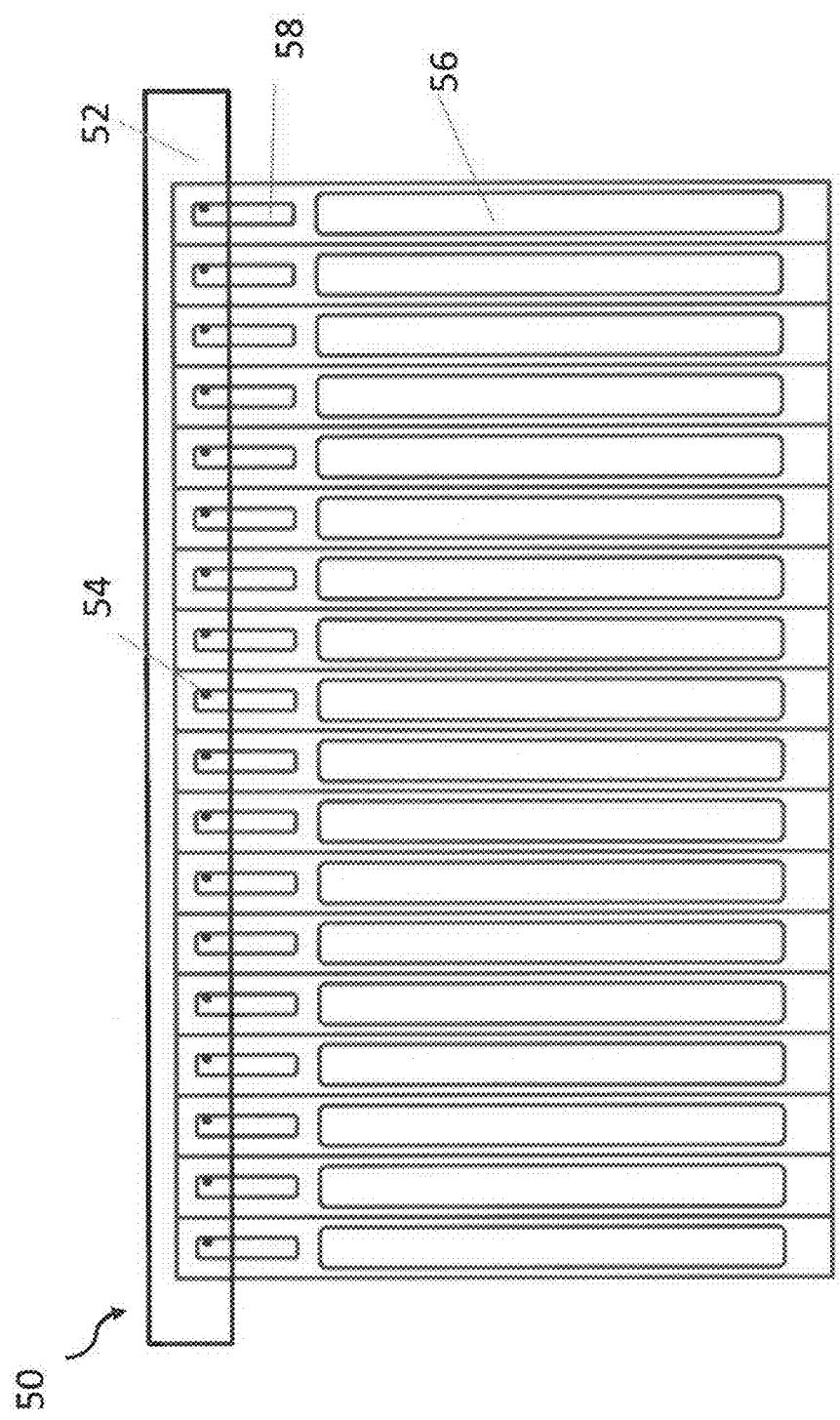
FIG. 5 shows one distributed weight system which can be used in accordance with embodiments of the present invention.

FIG. 5 shows one distributed weight system 50 which can be used in accordance with embodiments of the present invention. While FIG. 5 is drawn in two-dimensions showing length and width, it will be appreciated that the system 50 can be as deep as it is wide. The system 50 include a bar 52 having a plurality of pins 54 projection upwards (in the direction of the page). A plurality of rectangular weights 56 can be provided with each weight 56 including a channel 58 formed near its top. The channels 58 allow the pins 54 to slide through and allow the weights 56 to move freely up and down (in the direction of the page) so as adapt to any warpage of substrate. Pins 54 are held in the bar 52 on each end to retain the weights 54 and make them easy to apply and remove. Shallow channels or tapers may be provided in the sides of the weights to reduce sticking or friction between weights. The pins 54 could be any shape, but would have to fit into channel 58 of a long line of weights 56. It would then be attached to the end of the bar 52 so the independently moving weights could be moved together.

Figure 6:
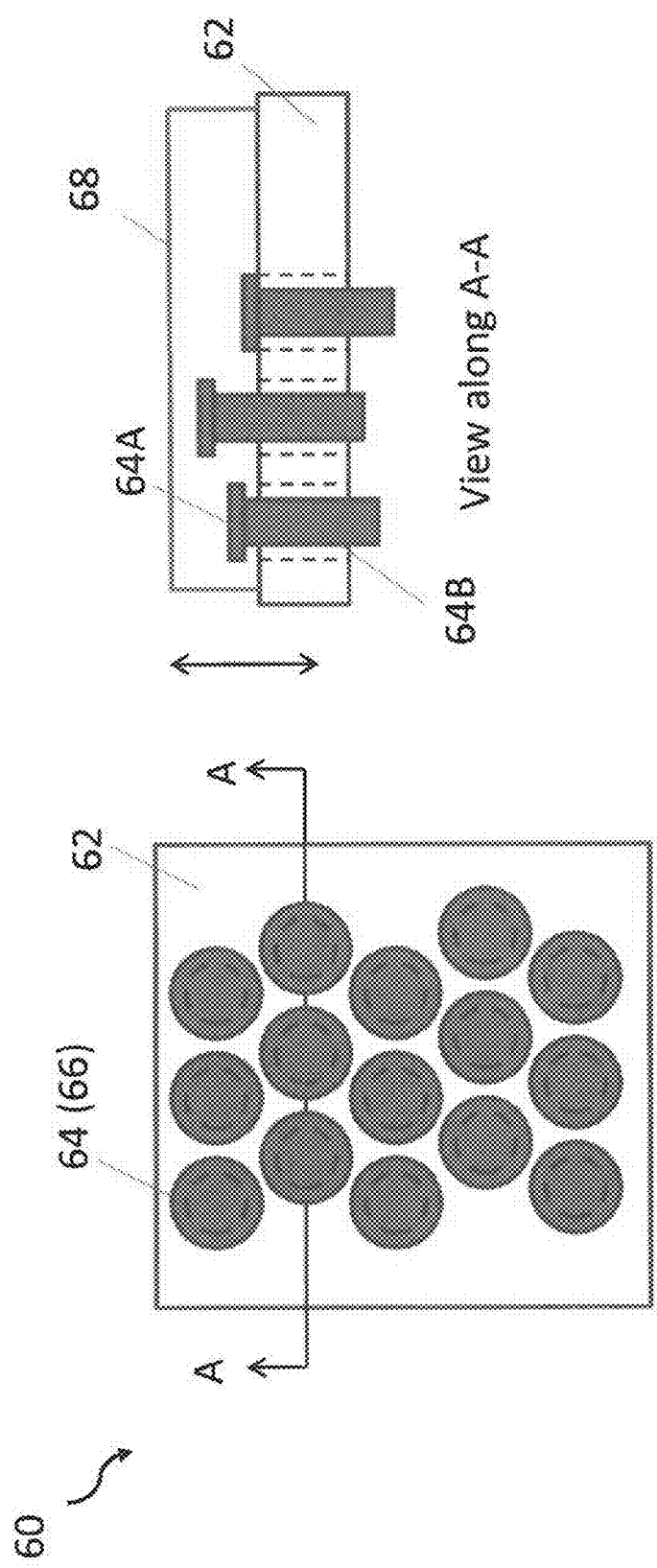
FIG. 6 shows another distributed weight system which can be used in accordance with embodiments of the present invention.

FIG. 6 shows another distributed weight system 60 which can be used in accordance with embodiments of the present invention. The system 60 includes a plate 62 having which enable a plurality of weights 64 to slide up and down with respect to the plate 62 through corresponding holes 66 formed in the plate 62. The head 64A of the weights 64 may be larger in diameter than the holes 66, whereas the body portion 64B of the weights may be made slightly smaller in diameter that the holes 66. That way, the relative height of each of weights 64 can individually be controlled. A canopy 68 can be provided which depends from the top surface of the plate 62. The canopy 68 limits the topmost height of the weights 64 and prevents the weights from falling out of the plate 62.

FIG. 7 is a photograph of a thick group III-Nitride Schottky structure that was annealed at 1150° C. for 1 hour using a weighed cover system formed of 400 μm thick sapphire. The thick sapphire that was used here only contacted and provided a force to the outer edges of the concave bowed Group III-Nitride composite structure. As can be seen in this photograph, only the outer edges of the III-Nitride film remain because the sapphire cover placed on the capped III-Nitride film was not thin enough to flex and provide a force to the center so only the outer edges of the concave bowed Group III-Nitride composite structure survived at 1150° C. The photograph has been annotated with a dotted line to show the demarcation of the covered (outside) and non-covered regions (inside).

The melting temperature of silicon is 1414° C. and silicon dioxide is approximately 1600° C., which are above the annealing temperature range of interest. The anneal temperatures of 1100 to 1350° C. is high enough for creep and slip plane deformation to allow these cover materials to conform to the dynamic bowing that would happen to Group III-Nitride composite films during anneal ramping. Thin silicon was used as the cover on thick III-Nitride structure with small ceramic cylindrical insulators added on top of the silicon cover to push the Silicon cover to deform to the concave contour. This stacked cover system was loaded into the annealing furnace and annealed up to 1350° C. in a nitrogen atmosphere. This system with silicon cover and weights successfully protected the III-Nitride composite structure over the whole surface when annealed up to 1350° C.

The silicon, sapphire and SiC covers have been inspected by SEM after annealing III-Nitride films. The silicon {(100), (110), and/or (111)} has visible slip planes on the surface. There is an inverse image of the III-Nitride surface formed into the silicon surface. Sapphire covers also deform and have inverse impressions in their surface, but they are not as pronounced.

FIGS. 8(I) and 8(II) are photographs of silicon and sapphire protective covers of weighed cover system 20, respectively, after annealing. It is apparent from these images there is a negative impression of the capped layer on the Si and sapphire covers where the inverse pattern of III-Nitride cap is visible.

A polished SiC cover was also tested (although no photograph is shown here). The SiC cover looked the same before and after the anneal process, i.e., it did not appear to plastically deform during the annealing. Thus, a SiC cover can be probably be used again and again while Si and sapphire might be able to only be used once.

The inventor conducted a study characterizing changes in the III-Nitride surface with scanning electron microscopy (SEM), atomic force microscopy (AFM) and optical profilometry and X-ray rocking curve before capping and after annealing with the annealing cap and weight cover system and subsequent cap removal. Two 2 GaN samples were annealed one with a 100 μm thick sapphire cover and one with a 100 μm thick silicon cover at 1300° C. for 30 minutes. They both worked to protect the annealing cap, although there was some deterioration noticed near the center of the sapphire covered wafer. This was believed to have occurred because the sapphire cover apparently did not conform enough to sufficiently apply force in the center to overcome concave bowing.

Figure 9:
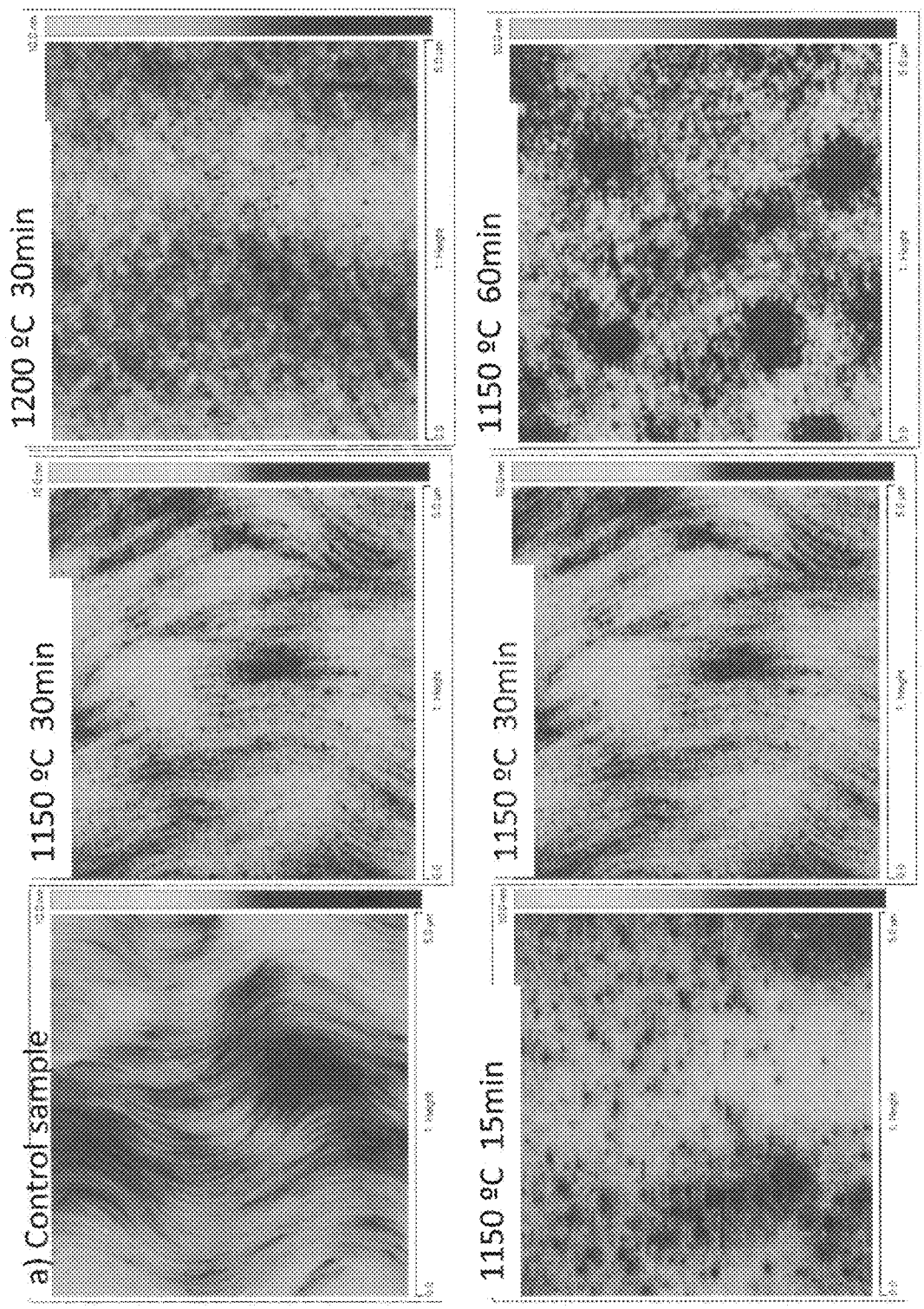
FIG. 9 shows various AFM topographs of GaN surfaces of the III-Nitride after annealing at temperatures of 1150, 1200, 1250 and 1300° C. for 20 minutes and 1150° C. for 15, 30, 60, 90 and 120 minutes.
Figure 9:
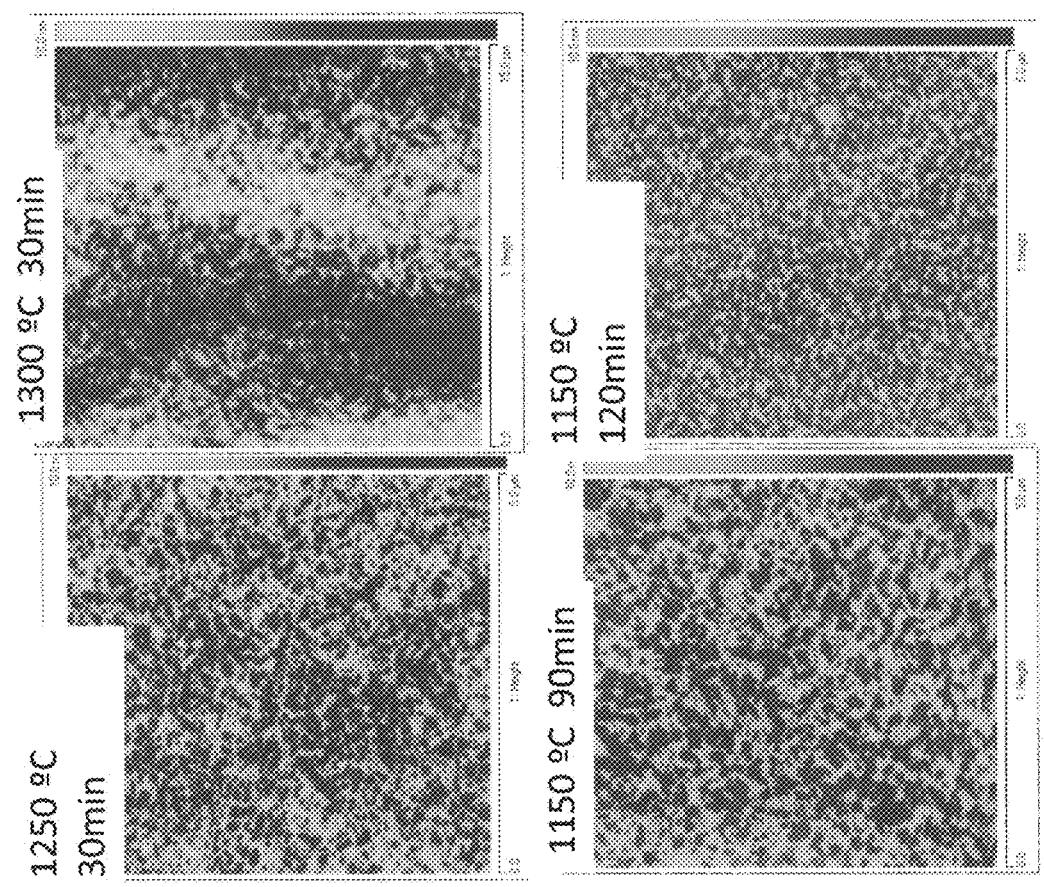
Figure 11A:
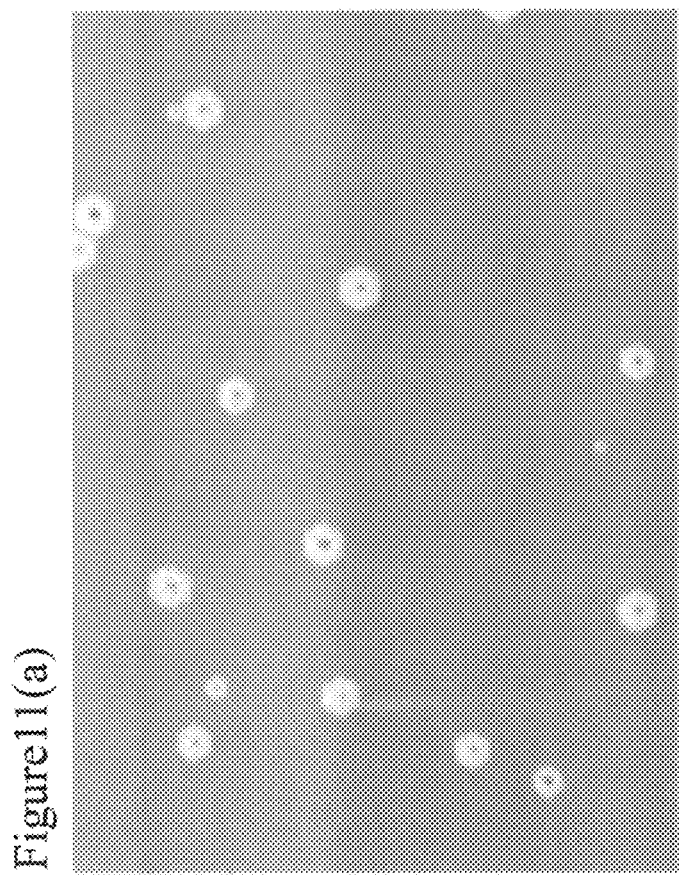
FIG. 11(a) show the surface before annealing and FIGS. 11(b)-(e) show the same surface after annealing at temperatures of 1150, 1200, 1250 and 1300° C., respectively.
Figure 11C:
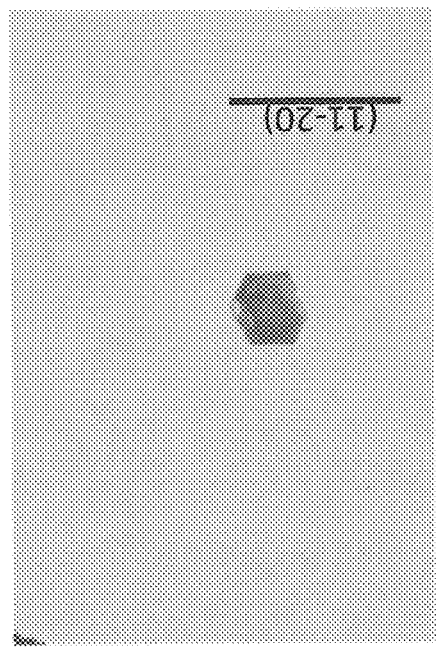
Figure 11E:
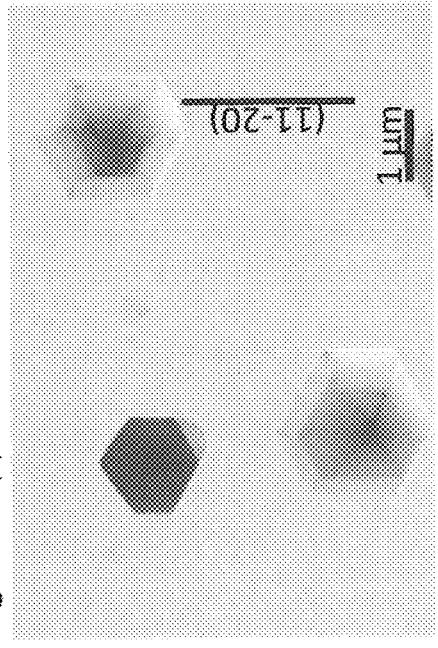
Figure 11B:
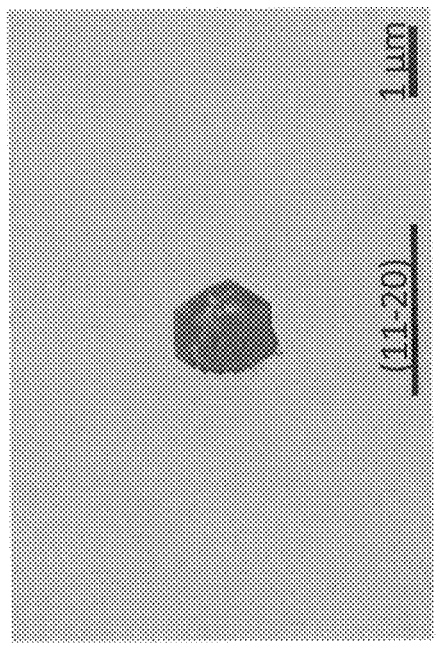
Figure 11D:
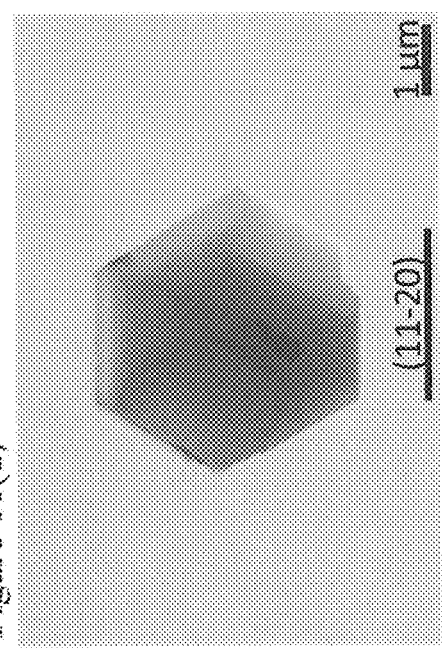

FIG. 9 shows AFM topographs of GaN surfaces of the III-Nitride after annealing at temperatures of 1150, 1200, 1250 and 1300° C. for 20 minutes and 1150° C. for 15, 30, 60, 90 and 120 minutes. The surfaces had been covered with weighted cover systems during the anneal. Although, the topographs show increased roughness with increasing temperature, these weighed cover systems allowed the III-Nitride base to survive up to 1350° C. for 30 minutes which had not been previously achieved. It is expected that the novel weighted cover systems can successfully perform at even higher temperatures.

FIG. 10 is a table of Full Width at Half Maximum (FWHM) values from X-ray rocking curves before and after annealing of a series with increasing temperature and time increments. X-ray rocking curves of the (002) and (102) orientations showed decreasing FWHM with increasing temperature and time. At temperatures above 1250° C., there were a few corners where the III-Nitride under the multilayer AlN annealing cap decomposed to Ga metal, but the majority of the samples survived and improved in crystal quality. The thin silicon covers had a variety of different oxide film thickness on them. It was found that the cover 3 material protected better if the oxide film is not removed, such as by an HF etch. Si cover reaction with the localized III-nitride decomposition near the edges appears to degrade the AlN cap protection.

Localized failures that have occurred show that decomposition of III-Nitride is not homogeneous. Hexagonal pits form having different characteristics at different temperatures. The hexagonal pit walls intersect the c-plane of the III-Nitride in a direction parallel to the (11-20) flat and the slope of the pits increases with increasing temperature. Decomposition is found to be more vertical than horizontal, especially with increasing temperature, with {11-2i} planes decomposing at lower rates.

FIG. 11 shows SEM micrographs of GaN surface defects. FIG. 11(a) show the surface before annealing and FIGS. 11(b)-(e) show the same surface after annealing at temperatures of 1150, 1200, 1250 and 1300° C., respectively. The SEM micrographs show that the side walls of the pits are parallel to the (11-20) flat, and therefore the [−1100] direction, so the side walls of the pits are parallel to the {11-2 i} planes. It is noted that the pits get deeper and the side walls become steeper with increasing temperature. The walls of the pits created by decomposition have been found to generally intersect the C-plane parallel to (11-20).

Nitrogen vapor pressure works to delaminate the AlN annealing cap which leads to failure of cap from either cracks or forms a blow hole. After the AlN film breaks the exposed C-plane face decomposition of III-Nitride into Ga and N accelerates due to lower nitrogen vapor over-pressure. The surrounding areas which did not delaminate from the AlN cap do not decompose at an accelerated rate. A hexagonal pit is formed at this delamination site with sidewalls formed by {11-2 i} planes that decompose at slow rates.

Accordingly, various methods and systems for preventing the escape of nitrogen from a Group-III nitride semiconductor covered with an annealing cap during annealing have been shown in accordance with embodiments of the present invention. The annealing is used for activation of ion implanted dopants in the Group III-nitride semiconductor. During the anneal, a weighted cover system is configured to be placed on top of a Group-III nitride semiconductor covered with an annealing cap for preventing the escape of nitrogen from the capped semiconductor during annealing. In some embodiments, the weighted cover system may include a thin protective cover and weights that are configured to provide a downward force that inhibits or works against the force created by nitrogen vapor pressure from III-Nitride decomposition.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

All patents, patent applications, articles and other references mentioned herein are hereby incorporated by reference in their entireties.

While the foregoing is directed to embodiments of the present invention, other and further embodiments of the invention may be devised without departing from the basic scope thereof, and the scope thereof is determined by the claims that follow.

I claim:

1. A method for preventing the escape of nitrogen from a Group-III nitride semiconductor covered with an annealing cap during annealing, the method comprising:
    covering the annealing cap on the Group-III nitride semiconductor with a weighted cover system comprising a protective cover placed on top of the capped Group-III nitride semiconductor; and
    annealing the Group-III nitride semiconductor while covered with the weighted cover system at a temperate in excess of 1250° C. for at least 30 minutes,
    wherein the weighted cover system provides a sufficient force for preventing the escape of nitrogen from the capped Group-III nitride semiconductor and delamination of the annealing cap from the Group-III nitride semiconductor during said annealing; and
    wherein the protective cover has sufficient flexibility and sufficient force applied to permit it to conform to the bow or warpage of the capped semiconductor and to maintain intimate contact with the capped semiconductor surface during the annealing.

2. The method of claim 1, further comprising:
    forming the annealing cap on the Group-III nitride semiconductor.

3. The method of claim 2, wherein forming the annealing cap comprises:
    depositing a first layer onto the semiconductor that acts as an adhesion and stress reduction layer; and
    depositing a second layer onto the first layer that acts as a mechanical support layer.

4. The method of claim 2, wherein forming the annealing cap comprises:
    forming annealing caps on opposed surfaces of the semiconductor.

5. The method of claim 1, further comprising:
    providing an inert atmosphere or environment inside an annealing furnace for annealing.

6. The method of claim 1, further comprising:
    removing the weighted cover system and the annealing cap from the annealed semiconductor.

7. An annealing system for annealing in a furnace comprising:

a Group-III nitride semiconductor;

an annealing cap formed on the semiconductor; and a weighted cover system placed on top of the capped Group-III nitride semiconductor comprising a protective cover placed on top of the capped Group-III nitride semiconductor, wherein the weight cover system is configured to apply a sufficient force for preventing the escape of nitrogen from the capped semiconductor and delamination of the annealing cap from the Group-III nitride semiconductor during annealing at temperatures in excess of 1250° C. for at least 30 minutes, and wherein the protective cover has sufficient flexibility and sufficient force applied to permit it to conform to the bow or warpage of the capped semiconductor and to maintain intimate contact with the capped semiconductor surface during the annealing.

8. The annealing system of claim 7, wherein the sufficient force is applied to the weighted cover system and to the capped Group III nitride semiconductor, by actual weight or a force equivalent to weight by a clamping apparatus, a pressure bladder, or a pressurized chamber.

9. The annealing system of claim 7, wherein the weighted cover system is readily removable from the capped Group-III nitride semiconductor.

10. The annealing system of claim 7, wherein the Group-III nitride semiconductor is formed of gallium nitride (GaN).

11. The annealing system of claim 7, further comprising: an additional protective cover placed under the capped Group-III nitride semiconductor.

12. The annealing system of claim 7, wherein the annealing cap comprises:

a first layer formed on the semiconductor that acts as an adhesion and stress reduction layer; and a second layer formed on the first layer that acts as a mechanical support layer.

13. The annealing system of claim 12, wherein the first and second layers of the annealing cap each are formed of aluminum nitride (AlN).

14. The annealing system of claim 7, wherein the weighted cover system comprises:

one or more weights placed on the protective cover to provide the sufficient force to the protective cover that is placed on the capped semiconductor.

15. The annealing system of claim 14, wherein the protective cover is formed of a refractory material.

16. The annealing system of claim 14, wherein the protective cover is formed of sapphire, SiC materials, Si, ZrO, MgO, YSZ, coated Si, or quartz.

17. The annealing system of claim 14, wherein the thickness of the protective cover is about 40-100 μm.

18. The annealing system of claim 14, wherein the protective cover is sized larger than the surface of the capped semiconductor for which it covers.

19. The annealing system of claim 14, wherein the surface of the protective cover which faces the capped semiconductor is polished.

20. The annealing system of claim 14, wherein the protective cover is provided with a ring on its top surface that is configured to hold the one or more weights.

21. The annealing system of claim 14, wherein the protective cover is provided with a rim on its bottom surface that is configured to prevent the protective cover from sliding off the capped semiconductor.

22. The annealing system of claim 14, wherein there is a plurality of weights arranged in a hexagonal or square packing orientation, with adjacent weights contacting one another, placed on the protective cover.

23. The annealing system of claim 14, wherein there is a plurality of weights held in a distributed weight system configured to enable the individual weights to move as the capped semiconductor bows or warps and apply weight more evenly across the surface thereof.

24. The annealing system of claim 14, wherein the total weight of the one or more weights is 0.0245 N to provide the sufficient force to the annealing cap.

* * * * *